(12) United States Patent
Ramm et al.

(10) Patent No.: US 10,041,017 B2
(45) Date of Patent: Aug. 7, 2018

(54) COATING WITH ENHANCED SLIDING PROPERTIES

(71) Applicant: Oerlikon Trading AG, Trubbach, Trubbach (CH)

(72) Inventors: Jurgen Ramm, Maienfeld (CH); Florian Seibert, Sevelen (CH); Beno Widrig, Bad Ragaz (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 34 days.

(21) Appl. No.: 14/384,896

(22) PCT Filed: Mar. 11, 2013

(86) PCT No.: PCT/EP2013/000711
§ 371 (c)(1),
(2) Date: Sep. 12, 2014

(87) PCT Pub. No.: WO2013/135364
PCT Pub. Date: Sep. 19, 2013

(65) Prior Publication Data
US 2015/0011444 A1 Jan. 8, 2015

Related U.S. Application Data

(60) Provisional application No. 61/609,415, filed on Mar. 12, 2012.

(51) Int. Cl.
C10M 103/06 (2006.01)
C23C 14/00 (2006.01)
(Continued)

(52) U.S. Cl.
CPC ....... C10M 103/06 (2013.01); C23C 14/0073 (2013.01); C23C 14/0641 (2013.01); C23C 14/0676 (2013.01); C23C 14/325 (2013.01)

(58) Field of Classification Search
None
See application file for complete search history.

(56) References Cited

U.S. PATENT DOCUMENTS 6,391,457 B1 * 5/2002 Welty ............... B05D 5/067
428/412
2005/0048217 A1 * 3/2005 Taylor ............... C23C 4/02
427/446
(Continued)

FOREIGN PATENT DOCUMENTS

GB 2 054 648 A 2/1981
WO 2012/055485 A1 5/2012

OTHER PUBLICATIONS

Guo et.al. Surface & Coatings Technology. 186 (2004), 353-363.*
(Continued)

Primary Examiner — Vera Katz
(74) Attorney, Agent, or Firm — Pearne & Gordon LLP

(57) ABSTRACT

The present invention relates to coated sliding parts having coating systems which allow better sliding performance under dry and/or under lubricated conditions. The coating systems according to the present invention being characterized by having an outermost layer which—is a smooth oxide-containing layer in case of sliding applications under lubricated conditions, or—is a self-lubricated layer comprising molybdenum nitride, in case of sliding applications under dry or lubricated conditions, is a selflubricated layer with a structured surface comprising a multitude of essentially circular recesses with diameters of several micrometers or below, the recesses randomly distributed over the surface.

9 Claims, 11 Drawing Sheets

Draft of a coating for sliding parts which must be used under lubricated conditions according to the first aspect of the present invention.

(51) Int. Cl.
*C23C 14/06* (2006.01)
*C23C 14/32* (2006.01)

(56) References Cited

U.S. PATENT DOCUMENTS

| | | | |
|---|---|---|---|
| 2005/0118441 A1* | 6/2005 | Tenmaya | C23C 28/048 428/469 |
| 2010/0209730 A1* | 8/2010 | Thomsen | C03C 17/36 428/623 |

OTHER PUBLICATIONS

Barbosa J. et al. "Properties of MoNxOy thin films as a function of the N/O ratio", Thin Solid Films, vol. 494, No. 1-2 dated Jan. 3, 2006.

Zega B. "Hard and Ductile Molybdenum Coatings with Low Friction Deposited by Magnetron Sputtering" Asle Special Publication, dated Jan. 1, 1984.

Urgen M. et al. "Characterization of molybdenum nitride coatings produced by arc-PVD technique" Surface and Coatings Technology; vol. 94-95, No. 1-3, dated Apr. 21, 1997.

\* cited by examiner

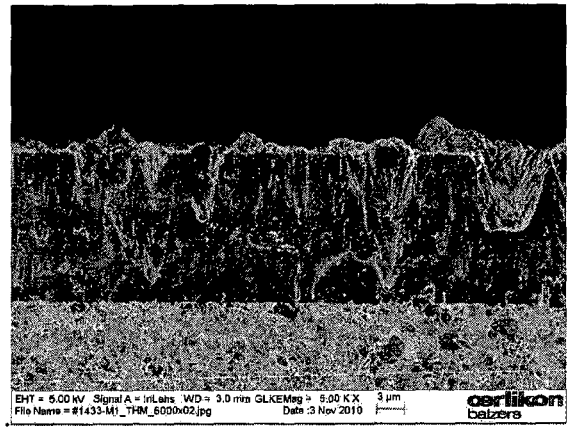
*Figure 1*: Fracture cross section of the un-polished $Cr_{1.0}N_{1.0}$ coating (sample A).
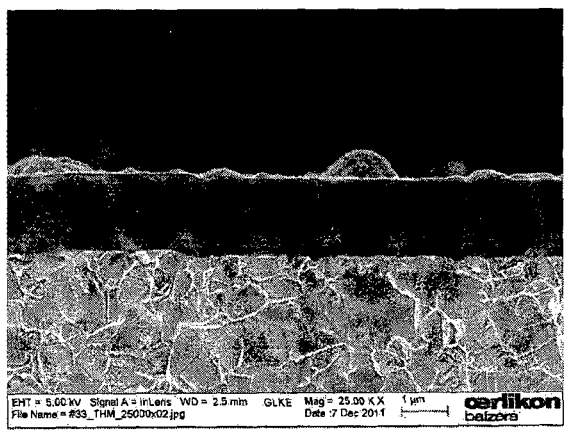
*Figure 2*: Fracture cross section of the un-polished ta-C coating (sample B).
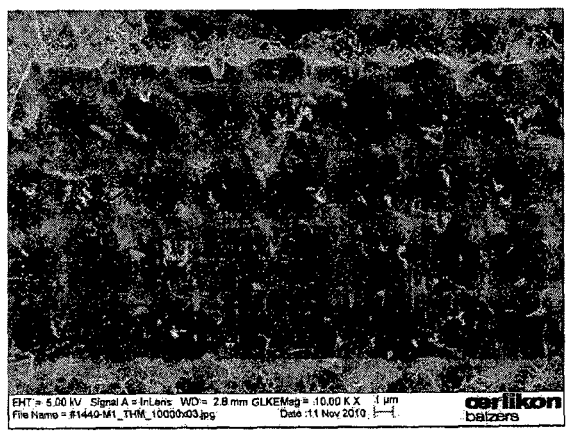
*Figure 3*: Fracture cross section of the un-polished $Al_{0.76}Mo_{0.24}N_{1.15}$ coating (sample C).

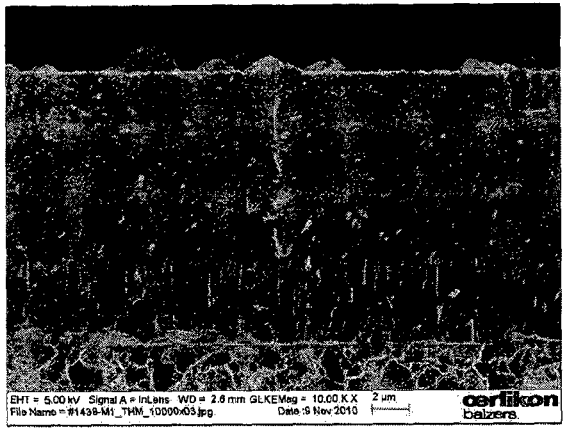
*Figure 4*: Fracture cross section of the un-polished $Mo_{1.0}N_{1.0}$ coating (sample D).
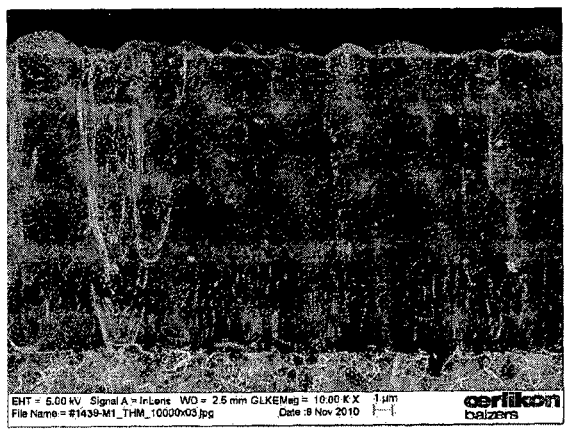
*Figure 5*: Fracture cross section of the un-polished $Mo_{1.0}N_{1-x}O_x$ coating (sample E).
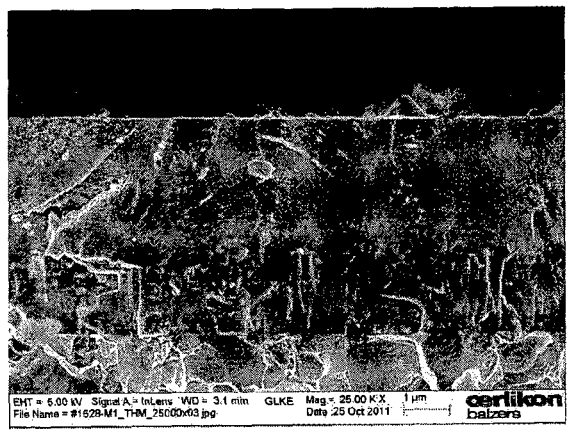
*Figure 6a*: Fracture cross section of the un-polished $Mo_{0.85}Cu_{0.15}N_{1.0}$ coating (sample F).

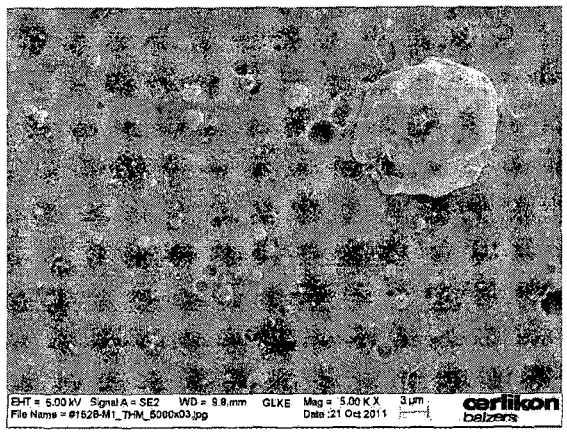
*Figure 6b*: SEM surface micrograph of the un-polished $Mo_{0.85}Cu_{0.15}N_{1.0}$ coating (sample F).
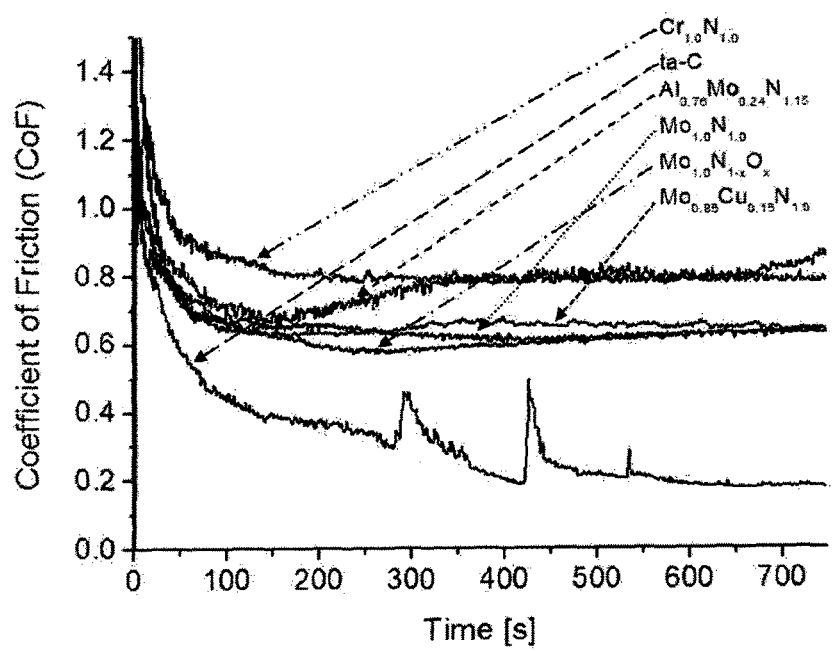
*Figure 7*: Coefficient of friction in function of time in the reciprocating wear test for unpolished samples and under dry conditions.

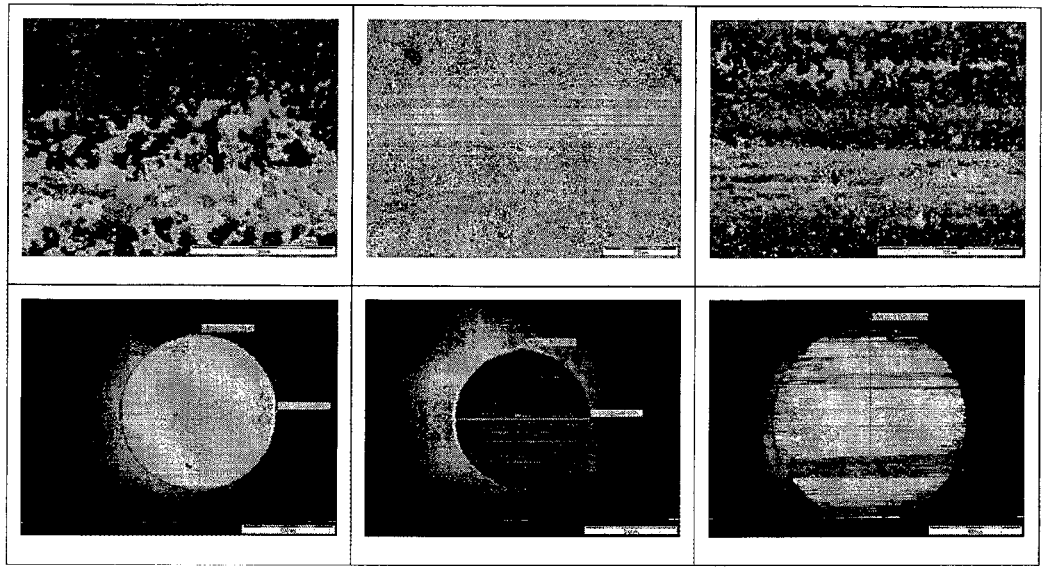
*Figure 8a:* Wear track (above) and counter-part wear (below) for unpolished samples and under dry conditions for $Cr_{1.0}N_{1.0}$, ta-C and $Al_{0.76}Mo_{0.24}N_{1.15}$ (from left to right).
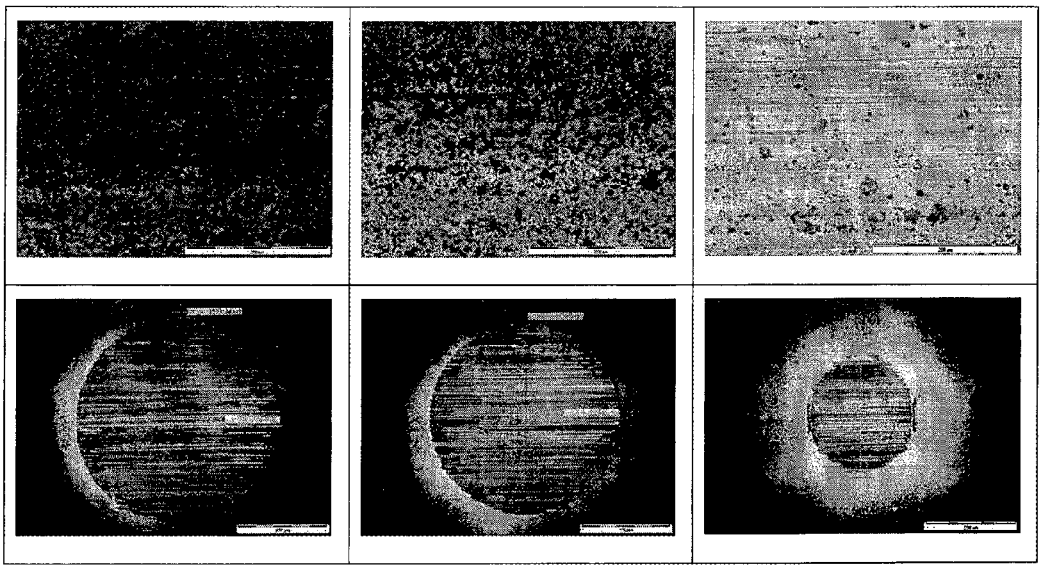
*Figure 8b:* Wear track (above) and counter-part wear (below) for unpolished samples and under dry conditions for $Mo_{1.0}N_{1.0}$, $Mo_{1.0}N_{1-x}O_x$ and $Mo_{0.85}Cu_{0.15}N_{1.0}$ (from left to right).

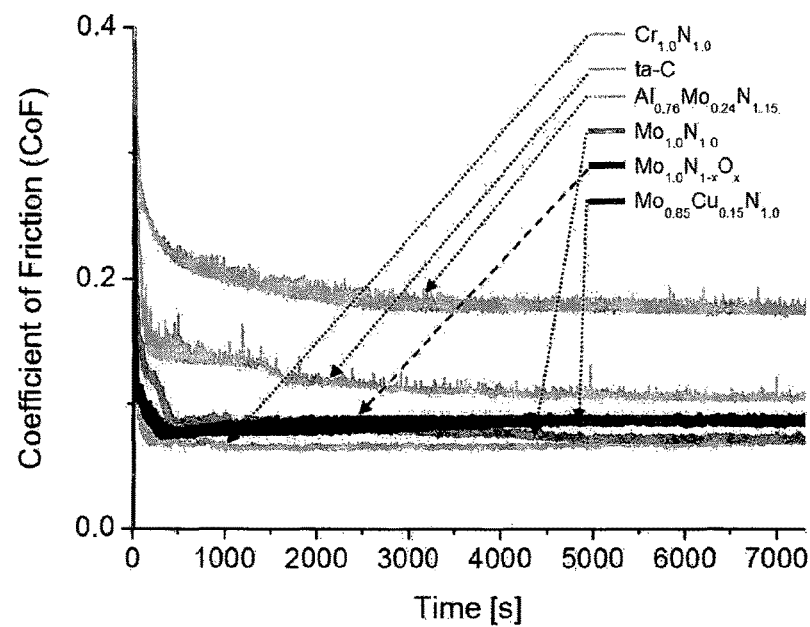
*Figure 9:* Coefficient of friction in function of time in the reciprocating wear test for polished samples and lubricated conditions.

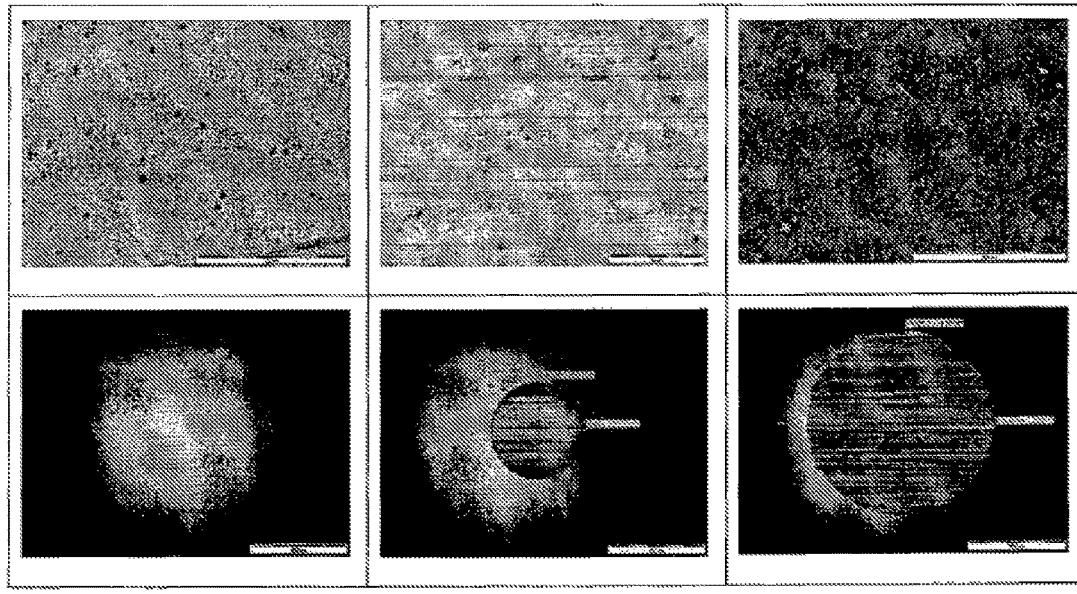
*Figure 10a:* Wear track (above) and counter-part wear (below) for polished samples and lubricated conditions for $Cr_{1.0}N_{1.0}$, ta-C and $Al_{0.76}Mo_{0.24}N_{1.15}$ (from left to right).
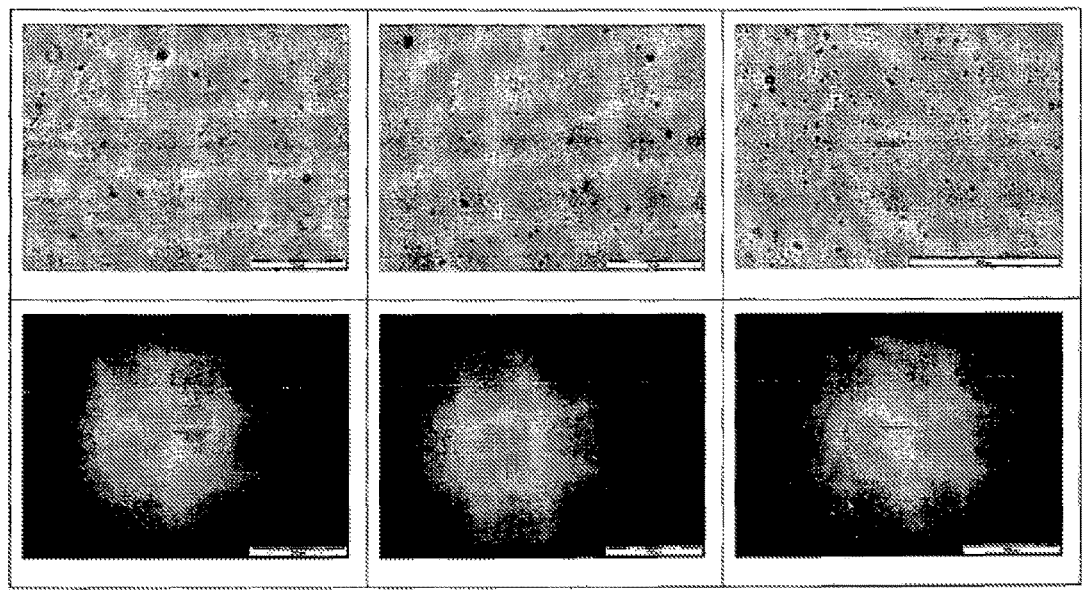
*Figure 10b:* Wear track (above) and counter-part wear (below) for polished samples and lubricated conditions for $Mo_{1.0}N_{1.0}$, $Mo_{1.0}N_{1-x}O_x$ (from left to right).

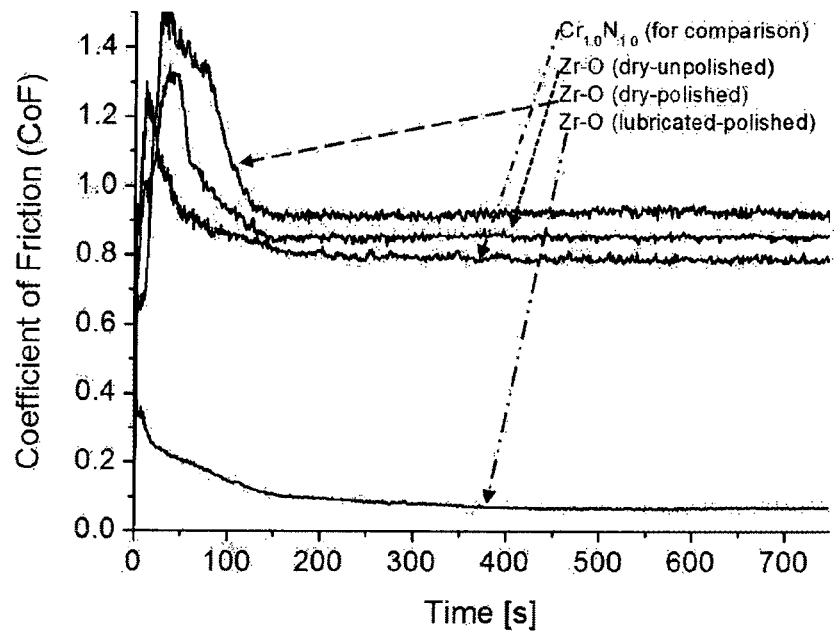
*Figure 11a:* Coefficient of friction in function of time in the reciprocating wear test of Zr-O coated parts under dry-unpolished, dry-polished and polished-lubricated conditions.
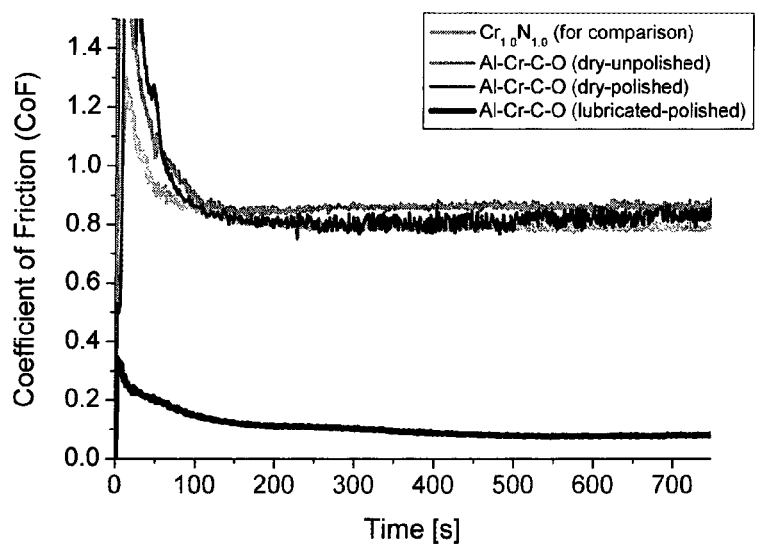
*Figure 11b:* Coefficient of friction in function of time in the reciprocating wear test of Al-Cr-C-O coated parts under dry-unpolished, dry-polished and polished-lubricated conditions.

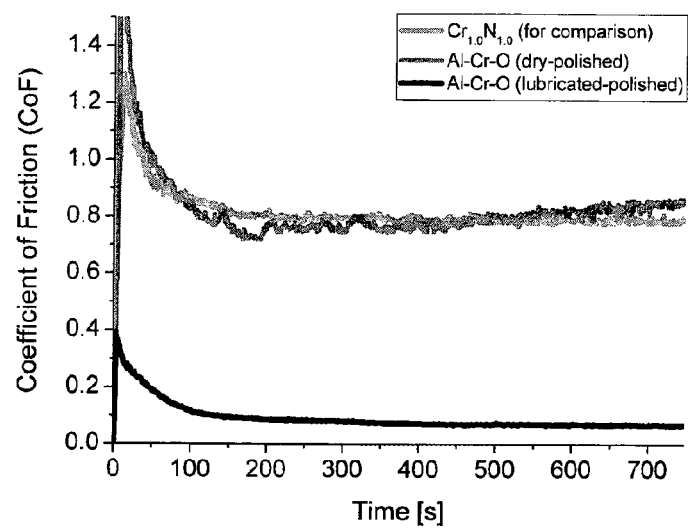
*Figure 11c:* Coefficient of friction in function of time in the reciprocating wear test of Al-Cr-O coated parts under dry-unpolished, dry-polished and polished-lubricated conditions.
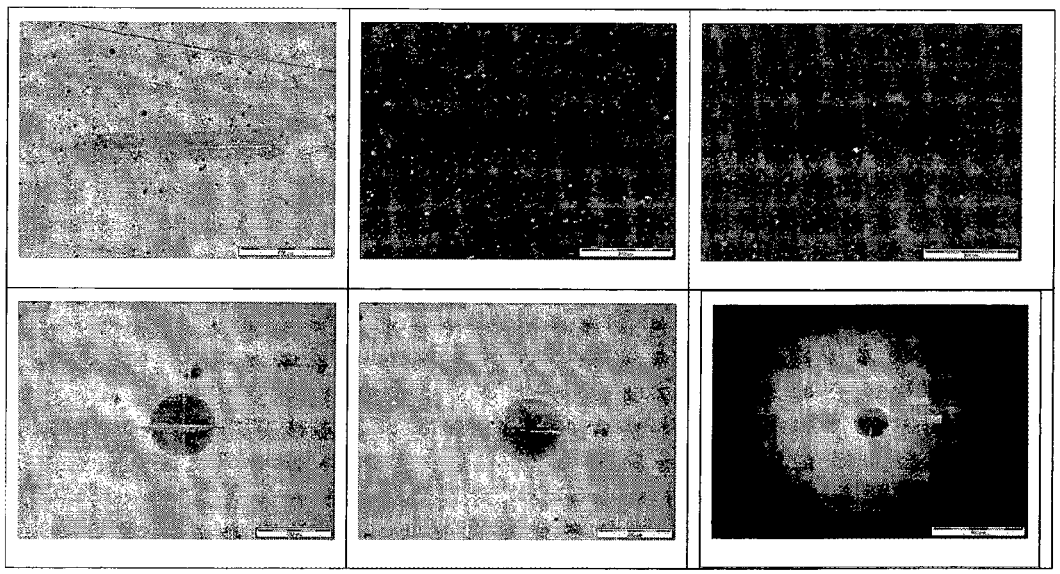
*Figure 12:* Wear track (above) and counter-part wear (below) for polished samples and lubricated conditions for Zr-O, Al-Cr-C-O and Al-Cr-O (from left to right).

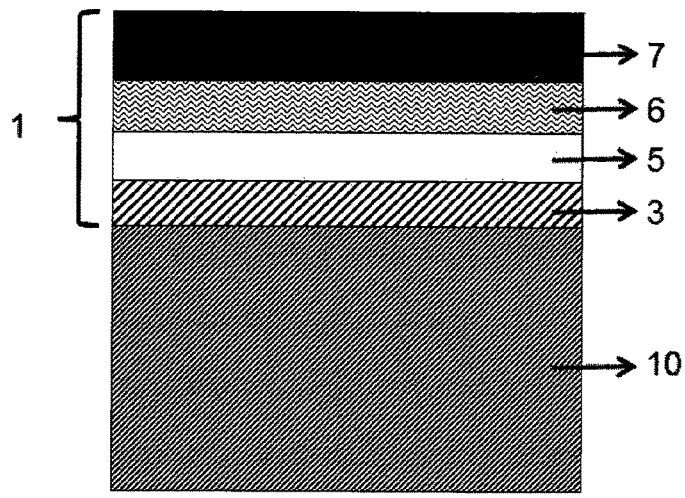
*Figure 13a:* Draft of a coating for sliding parts which must be used under lubricated conditions according to the first aspect of the present invention.
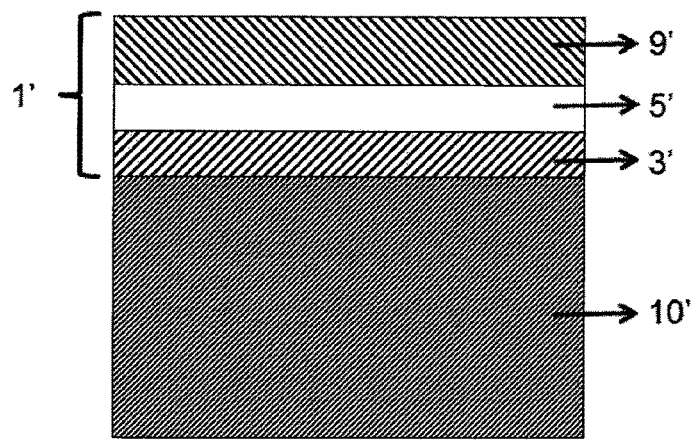
*Figure 13b:* Draft of a coating for sliding parts which can be used under dry as well as under lubricated conditions according to the second aspect of the present invention having a metal nitride containing layer 5'.

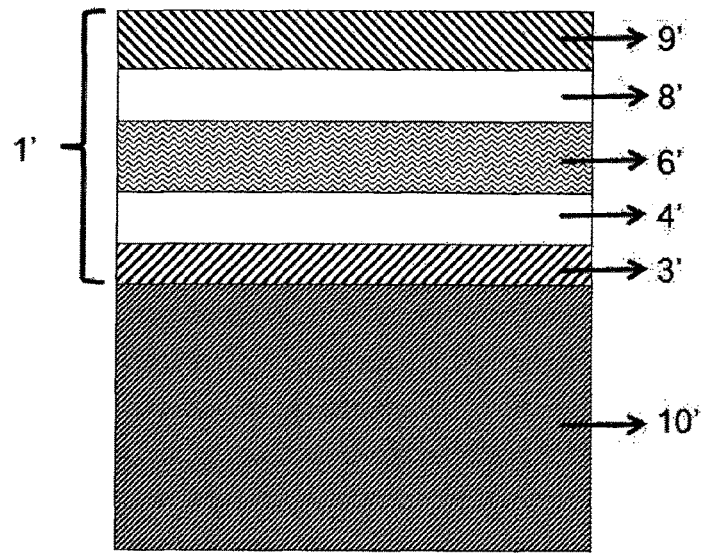

*Figure 13c:* Draft of a coating for sliding parts which can be used under dry as well as under lubricated conditions according to the second aspect of the present invention having a metal oxide containing layer 6'.

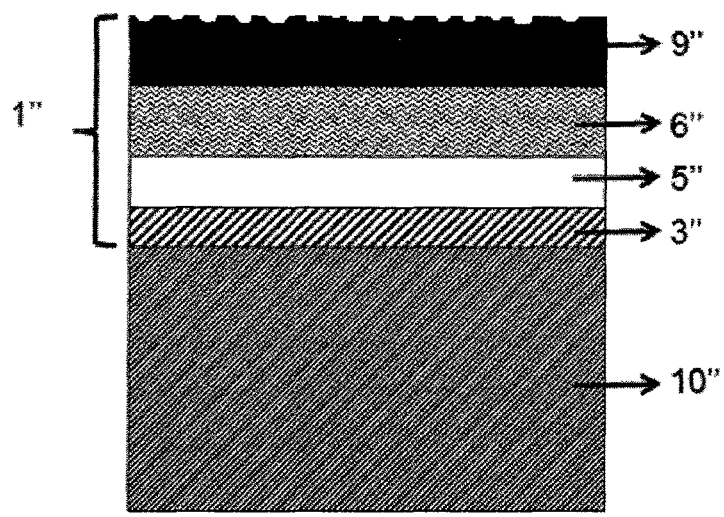

*Figure 13d:* Draft of a coating for sliding parts which can be used under dry (if 9" is a self-lubricated layer) as well as under lubricated conditions (if 9" is a metal oxide containing layer as well as if 9" is a self-lubricated layer) according to the third aspect of the present invention having one structured layer 9" as an outermost layer.

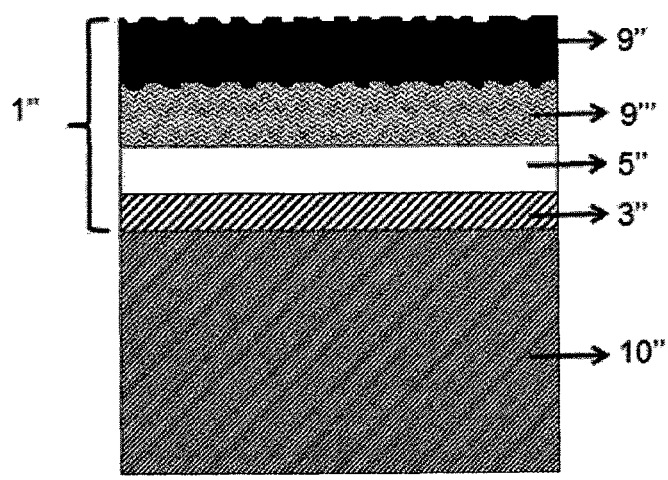
*Figure 13e:* Draft of a coating for sliding parts which can be used under dry as well as under lubricated conditions according to the third aspect of the present invention having two structured layers 9''. The outermost structured layer is a self-lubricated layer and the lower structured layer 9''' is for example a structured metal oxide containing layer.

COATING WITH ENHANCED SLIDING PROPERTIES

The present invention relates to coated sliding parts having coating systems which allow better sliding performance under dry and/or under lubricated conditions. Some of the coating systems which are provided are particularly suitable for high temperature applications, for example in tribological systems. Furthermore, the present invention relates to methods for accomplishing surface treatments on sliding parts according to the present invention.

STATE OF THE ART

Current developments in the automotive industry are mostly driven by the market demand for higher fuel efficiency of vehicles and the proposed legislation to control their emission, e.g. the regulation No 715/2007 of the European Community. New technological approaches offer not only attaining higher engine efficiency, but also better efficiency of the entire power train system. These new technologies are to be used in new concepts of vehicles for future generations and particularly for attaining the demanded $CO_2$ reduction.

Lighter materials for moving parts in the power train, low-friction lubricants and an improved temperature cycling management in combination with higher operation temperature of the engine should contribute for improving fuel economy.

Furthermore, the use of new fuels, in particularly of eco-friendly fuels which are produced from bio-products or which contain new oil additives, produces the need of using materials having increased chemical, mechanical and thermal stability. Additionally, the selection of material used in the automotive industry is also very influenced for the need of reducing costs.

Engineering of material surfaces by applying coatings has become an important aspect for the design of tribological systems. Thin PVD coatings consisting of metal nitrides, metal-carbon compounds and hard carbon layers have been used successfully to coat different components of the power train. $Cr_xN$ coatings have been found to reduce piston ring wear and to improve sliding properties in piston-liner groups. The tribological properties of $Cr_xN$ have been studied with respect to contained phases, multi-layer structures, and fretting behaviour. Because of its importance for applications, there have been attempts to model the wear behavior of this material system. The synthesis of arc evaporated $Cr_xN$ coatings has been described and microstructure and mechanical properties of these coatings were characterized and the wear of arc deposited $Cr_xN$ coatings was studied. Therefore, $Cr_xN$ was utilized as "standard" for the comparison with the other materials discussed in this work.

Metal-carbon and diamond-like coatings support the trend in automotive industry for better fuel efficiency. Tungsten and carbon (a-C:H:W) containing coatings on gear surfaces lower the friction and increase engine efficiency. Diamond-like carbon layers on injection needles of common-rail diesel systems of cars help to keep clearances tight for the high injection pressures needed. Coatings of a-C:H:W and diamond-like coatings (a-C:H) are produced mostly in combination of reactive sputtering and plasma activated CVD (PACVD) processes while tetrahedral amorphous (hydrogen-free) carbon is often prepared by cathodic arc evaporation. In PACVD, gaseous precursors are utilized which result in typical hydrogen contents between 5 and 30 at. % in the synthesized coatings. This limits the stability of the materials to temperatures of about 300° C. and was one reason to investigate the tribological properties of hydrogen-free carbon coatings. Despite many existing applications, carbon containing coatings are still an important field of research which is well summarized in comprehensive reviews.

Future engine development needs the selection of new coating materials which support the functional design of complex tribological systems. Based on the demands for better fuel efficiency discussed above, PVD coatings may be utilized to control wear in low viscosity lubricants, to protect standard materials in high temperature and oxidizing environment and to adapt the wear between different materials. Based on the variation in deposition methods, diamond-like carbon coatings show a different triobological behavior for lubricants indicating that chemical reactions with formulated oils and additives have to be considered for the optimization of the tribological contact for these materials.

Facing all the parameters influencing the performance of tribological systems, new coating materials have to be designed with improved wettability for oils and their additives and better chemical and thermal stability. MoN (with and without Cu doping) is one promising material which has been studied and also already tested for piston ring applications. A pre-selection of new coating materials by real engine tests is, however, too expensive. Therefore, materials and material modification may likely be neglected for cost issues and already existing coating materials may be utilized without challenging them for the real best solution.

Objective of the Present Invention

The objective of the present invention is to provide one or more coating systems for sliding parts which allow better sliding performance regarding friction and wear behavior under both dry conditions and lubricated conditions in comparison to the state of the art.

DESCRIPTION OF THE INVENTION

The present invention provides coating systems for sliding parts for applications under dry conditions as well as under lubricated conditions.

A first aspect of the present invention relates to a coating system for achieving better sliding performance under lubricated conditions. This coating system comprises an oxide-containing layer as it is drafted in FIG. 13a.

A second aspect of the present invention relates to a coating system for achieving better sliding performance under both lubricated and dry conditions. This coating system comprises a nitride-containing running-in layer comprising molybdenum nitride as it is drafted in FIGS. 13b and 13c. This coating system comprises additionally at least one oxide-containing layer or at least one nitride-containing layer.

A third aspect of the present invention relates to a coating system for achieving better sliding performance under both lubricated and dry conditions. This coating system comprises one or more structured layers as it is drafted in FIGS. 13d and 13e. The structured layers present smooth surface but having at least some holes which can be advantageous for the storage of lubricant.

A preferred embodiment of the present invention is a sliding component 10 at least partially coated with a coating system (according to the first aspect of the present invention mentioned above) for sliding applications performed under lubricated conditions. The coating system 1 (FIG. 13a) comprises an oxide-containing layer 7 whose surface is the outermost surface of the coating system 1. The surface of the oxide-containing layer 7 is a smooth or smoothed surface having reduced roughness peaks (the term smoothed surface is used in this context for specifying that the surface of the layer was treated in order to get it smooth). In the context of the present invention a surface which exhibits essentially no protrusions (peaks) but which can exhibit recesses (cavities) is referred to as a smooth surface. Furthermore, in the context of the present invention the recesses are also referred to as valleys or holes. Regarding the before mentioned definition of a smooth surface in the context of the present invention, it is expected that a low $R_{pk}$ value can be associated with a small amount of protrusions at the surface. The oxide-containing layer 7 consists of metal oxide and has element composition $Me_{1-b}O_b$ or contains mostly metal oxide and has element composition $Me_{1-b-c}X_cO_b$, with b>c or b>>c(b>>c in the context of the present invention means that b is at least twice as large as c), where:

Me is a metal or a combination of different metals having a concentration 1−b, or if applicable 1−b−c in atomic percent, O is oxygen having a concentration b in atomic percent, and if applicable X is a non-metal element different from O or X is a mixture of non-metal elements which doesn't contain O having a concentration c in atomic percent.

Preferably the oxide-containing layer 7 is an arc-PVD-deposited layer whose surface is post-treated in order to remove droplets and create valleys or holes at the coating surface. In the context of the present invention the term "creating valleys or holes" means not necessarily that cavities will be actively made at the surface during post-treatment. However, it can be that during post-treatment at least some droplets quarry out from the coating letting cavities at the surface. The post-treatment can be performed using for example polishing or burnishing methods.

Preferably X is nitrogen or carbon or contains nitrogen and/or carbon.

The coating system 1 can comprise between the substrate 10 and the oxide-containing layer 7 one or more layers of the type:

bonding strength layer 3 for improving coating adhesion such as for example a metal layer or a very thin metal layer formed on or in the substrate surface by metal ion etching, and/or metal nitride containing layer 5 such as for example a chromium nitride layer or a molybdenum nitride layer, and/or oxide-containing layer 6 having element composition $Me_{1-b}O_b$ or $Me_{1-b-c}X_cO_b$.

A further preferred embodiment of the present invention is a sliding component at least partially coated with a coating system (according to the second aspect of the present invention mentioned above) for sliding applications performed under dry or lubricated conditions. The coating system 1' (FIG. 13b-c) comprises a nitride-containing running-in layer 9' comprising molybdenum nitride.

In a variation of the preferred embodiment of the present invention with running-in layer 9', the running-in layer 9' consists of molybdenum oxynitride with element composition $Mo_dO_eN_f$, with d+e+f≈1, f>e, and d>e, where d, e and f are the concentrations of molybdenum, oxygen and nitrogen respectively in atomic percent. The molybdenum oxynitride running-in layer can for example be designed to have a monolayer or a multilayer or a gradient architecture.

An example of a multilayer architecture for Mo—O—N running-in layers according to the present invention is a combination of Mo—N and Mo—O layers. A combination of Mo—N and Mo—O layers means particularly in the in the context of the present invention alternating Mo—N and Mo—O single layers. In this case, the Mo—N single layers have element composition $Mo_mN_n$, where m and n are the concentration of molybdenum and nitrogen respectively in atomic percent. The Mo—O single layers having preferably an element composition according to the formula $Mo_vO_2$ with v≥w and where v and w are the concentration of molybdenum and oxygen respectively in atomic percent. Preferably, the single layers having a layer thickness smaller than 300 nm, for example between 5 and 300 nm, more preferably smaller than 150 nm. Preferably, at least some single layers in the multilayer architecture have a layer thickness smaller than 100 nm. A further example is a combination of Mo—N and Mo—O—N layers. One more example is a combination of multiple Mo—O—N single layers having different element compositions.

Preferably the Mo—O—N running layer is deposited using arc PVD techniques in a reactive nitrogen and/or oxygen atmosphere.

In a further variation of the preferred embodiment of the present invention including a running-in layer 9', the running-in layer 9' comprises additionally to molybdenum nitride at least one element whose melting point is lower than the molybdenum melting point. In this case the running-in layer 9' having an element composition $Mo_hZ_{LMPi}N_j$ with j+h+i≈1 and j>h>i, where j, h and i are the element concentration of nitrogen, molybdenum and the element or mixture of elements having lower melting point than molybdenum. Preferably the Mo—$Z_{LMP}$—N layer is deposited using arc PVD techniques. Preferably the arc PVD technique used for depositing the Mo—$Z_{LMP}$—N involves a reactive deposition process wherein at least one target comprising Mo and $Z_{LMP}$ is arc-evaporated in a nitrogen atmosphere. Preferably $Z_{LMP}$ is copper (Cu).

In one more variation of the preferred embodiment of the present invention with running-in layer 9', the coating system 1' comprises between the substrate 10' and the nitride-containing running-in layer 9' one or more metal nitride containing layers 5' (FIG. 13b). The one or more metal nitride containing layers 5' can be for example chromium nitride or molybdenum nitride layers.

In one more variation of the preferred embodiment of the present invention with running-in layer 9', the coating system 1' comprises between the substrate 10' and the nitride-containing running-in layer 9' one or more metal oxide containing layers 6' (FIG. 13c). the one or more metal oxide containing layers 6' can be for example zirconium oxide, aluminum chromium carbon oxide or aluminum chromium oxide layers. A coating system 1' according to this variation can be particularly suitable for using in sliding processes performed at elevated temperatures.

As it is drafted in FIG. 13b, the coating system 1' which comprises one or more metal nitride containing layers 5' can comprise additionally between the substrate 10' and the one or more metal nitride containing layers 5' one or more bonding strength layers 3' for improving coating adhesion.

As it is drafted in FIG. 13c, the coating system 1' which comprises one or more metal oxide containing layers 6' can comprise additionally between the substrate 10' and the one or more metal oxide containing layers 6' one or more bonding strength layers 3' for improving coating adhesion, and/or one or more metal nitride containing layers 4'. Additionally, this coating system 1' comprising one or more metal oxide containing layers 6' can also comprise one or more metal nitride containing layers 8' between the one or more metal oxide containing layers 6' and the nitride-containing running-in layer 9'.

A further preferred embodiment of the present invention is a sliding component 10" at least partially coated with a coating system (according to the third aspect of the present invention mentioned above) for sliding applications performed under dry or lubricated conditions. The coating system 1" comprises one or more structured layers 9" and 9''' as it is drafted in FIG. 13*d*-*e*. The surface of the one or more structured layers is smooth (i.e. it presents reduced roughness peaks) but with "valleys" (i.e. with small holes).

One variation of a coating system 1" regarding this preferred embodiment according to the present invention is drafted in FIG. 13*d*. The coating system 1" comprises only one structured layer 9" whose surface is the outermost surface of the coating system 1". Preferably the structured layer 9" is a metal oxide containing layer if the sliding process must be performed under lubricated conditions. Preferably the structured layer is a Mo—O—N or a Mo—$Z_{LMP}$—N layer such as for example a Mo—Cu—N layer if the sliding process must be performed under dry conditions. As it is drafted in FIG. 13*d*, the coating system 1" which comprises only one structured layer 9" can comprise additionally between the substrate 10" and the structured layer 9" one or more bonding strength layers 3" for improving coating adhesion and/or one or more metal nitride containing layers 5" and/or one or more metal oxide containing layers 6".

Another variation of a coating system 1" regarding this preferred embodiment according to the present invention is drafted in FIG. 13*e*. The coating system 1" comprises at least two structured layers 9" and 9'''. A first structured layer 9" is the outermost layer of the coating system and it is a self-lubricated layer. The self-lubricated layer is preferably a Mo—O—N or a Mo—$Z_{LMP}$—N layer such as for example a Mo—Cu—N layer. A second structured layer 9''' is arranged directly under the outermost layer and it is preferably a metal oxide containing layer if the sliding process must be performed under dry conditions and/or at high temperatures. As it is drafted in FIG. 13*e*, the coating system 1" which comprises at least two structured layers 9" and 9''' can comprise additionally between the substrate 10" and the structured layer 9" one or more bonding strength layers 3" for improving coating adhesion and/or one or more metal nitride containing layers 5" and/or one or more metal oxide containing layers 6".

The in the structured layers available small holes are in particular advantageous for the storage of fluid lubricant (FIG. 13*d*) according to the present invention. Furthermore, if above of one structured layer, for example a structured metal oxide containing layer a structured self-lubricated layer (which should operate as a running-in layer) is deposited, the small holes in the structured metal oxide containing layer can become particularly advantageous for the storage of particles of the self-lubricated layer (FIG. 13*e*).

For the synthesis of the structured layers 9" and 9''' according to the present invention are arc PVD techniques especially suitable. For improving the surface of the structured arc-deposited layers according to the present invention are polishing or burnishing post-treatments in particular recommended.

On this note are Mo—Cu—N layers deposited by means of arc PVD techniques according to the present invention especially suitable as self-lubricated layer for using in tribological systems, in particular in sliding systems which operate at elevated temperatures. Particularly better results can be obtained if the Mo—Cu—N layer is formed in such a manner that its structure exhibits a coating matrix with holes structure. The structure, more precisely quantity, form and distribution of the holes in the coating matrix of Mo—Cu—N layers can be specially influenced with the target composition in order to design the most suitable structure. The Mo—Cu—N layer can also be designed to have for example a monolayer or a multilayer or a gradient architecture.

Following in order to better explain the present invention, the results of investigation of a pre-selection of coating materials will be presented. The pre-selected coating materials were not tested first in engine tests but by using simple test methods in order to optimize development efforts. A reciprocating wear test was utilized to investigate the wear of substrate surfaces coated by very different materials utilizing cathodic arc evaporation and the wear of the uncoated steel counter-part. The response of the test to surface roughness and lubrication were analyzed.

The coating materials investigated in the context of the present invention were principally produced using reactive cathodic arc evaporation. This coating deposition technique was chosen primarily because of the following two reasons: (a) cathodic arc evaporation can be easily performed in reactive gases like nitrogen, oxygen or hydrocarbons without complex control of the reactive gases and (b) composite targets can be utilized which provide easy access to ternary and quarternary compounds. Moreover, reactive arc evaporation offers lower production costs compared to reactive sputtering. However, one disadvantage of the arc technology consists in the formation of droplets which are generated by the cathodic arc during the evaporation of the target surface. These droplets are incorporated in the coating during layer synthesis. The number of droplets can be reduced or even avoided utilizing steered arc (magnetic field supported) or filtered arc technology. Nevertheless, these last mentioned two technological solutions for avoiding droplets formation by arc deposition processes have drawbacks for industrial-scale production of coatings. The steered arc is difficult to stabilize in pure oxygen gas and the filtered arc results in decreased deposition rates. Therefore, the disadvantage of droplet generation by random arc was accepted knowing that under production conditions a polishing step is common. The investigations here intend to emphasize the straightforwardness to synthesize coating materials of very different properties by reactive arc evaporation and the possibility to classify their tribological and protective properties for sliding contacts by a simple test method, the reciprocating wear test.

BRIEF DESCRIPTION OF THE DRAWINGS

FIG. 1: Fracture cross section of the unpolished $Cr_{1.0}N_{1.0}$ coating (sample A).

FIG. 2: Fracture cross section of the unpolished ta-C coating (sample B).

FIG. 3: Fracture cross section of the unpolished $Al_{0.76}Mo_{0.24}N_{1.15}$ coating (sample C).

FIG. 4: Fracture cross section of the unpolished $Mo_{1.0}N_{1.0}$ coating (example D).

FIG. 5: Fracture cross section of the unpolished $Mo_{1.0}N_{1-x}O_x$ coating (sample E).

FIG. 6*a*: Fracture cross section of an unpolished $Mo_{0.85}Cu_{0.15}N_{1.0}$ coating (sample F).

FIG. 6*b*: SEM surface micrograph of an unpolished $Mo_{0.85}Cu_{0.15}N_{1.0}$ coating (sample F).

FIG. 7: Coefficient of friction in function of time in the reciprocating wear test for unpolished samples and under dry conditions.

FIG. 8a: Wear track (above) and counter-part wear (below) for unpolished samples and under dry conditions for $Cr_{1.0}N_{1.0}$, ta-C and $Al_{0.76}Mo_{0.24}N_{1.15}$ (from left to right).

FIG. 8b: Wear track (above) and counter-part wear (below) for unpolished samples and under dry conditions for $Mo_{1.0}N_{1.0}$, $Mo_{1.0}N_{1-x}O_x$ and $Mo_{0.85}Cu_{0.15}N_{1.0}$ (from left to right).

FIG. 9: Coefficient of friction in function of time in reciprocating wear test for polished samples and lubricated conditions FIG. 10a: Wear track (above) and counter-part wear (below) for polished samples and lubricated conditions for $Cr_{1.0}N_{1.0}$, ta-C and $Al_{0.76}Mo_{0.24}N_{1.15}$ (from left to right).

FIG. 10b: Wear track (above) and counter-part wear (below) for polished samples and lubricated conditions for $Mo_{1.0}N_{1.0}$, $Mo_{1.0}N_{1-x}O_x$ and $Mo_{0.85}Cu_{0.15}N_{1.0}$ (from left to right).

FIG. 11a: Coefficient of friction in function of time in the reciprocating wear test of Zr—O coating parts under dry-unpolished, dry-polished and polished-lubricated conditions.

FIG. 11b: Coefficient of friction in function of time in the reciprocating wear test of Al—Cr—C—O coated parts under dry-unpolished, dry-polished and polished-lubricated conditions.

FIG. 11c: Coefficient of friction in function of time in the reciprocating wear test of Al—Cr—O coated parts under dry-unpolished, dry-polished and polished-lubricated conditions.

FIG. 12: Wear track (above) and counter-part wear (below) for polished samples and lubricated conditions for Zr—O, Al—Cr—C—O and Al—Cr—O (from left to right).

FIG. 13a: Draft of a coating for sliding parts which must be used under lubricated conditions according to the first aspect of the present invention.

FIG. 13b: Draft of a coating for sliding parts which can be used under dry as well as under lubricated conditions according to the second aspect of the present invention having a metal nitride containing layer 5'.

FIG. 13c: Draft of a coating for sliding parts which can be used under dry as well as under lubricated conditions according to the second aspect of the present invention having a metal oxide containing layer 6'.

FIG. 13d: Draft of a coating for sliding parts which can be used under dry (if 9" is a self-lubricated layer) as well as under lubricated conditions (if 9" is a metal oxide containing layer as well as if 9" is a self-lubricated layer) according to the third aspect of the present invention having one structured layer 9" as an outermost layer.

FIG. 13e: Draft of a coating for sliding parts which can be used under dry as well as under lubricated conditions according to the third aspect of the present invention having two structured layers 9". The outermost structured layer is a self-lubricated layer and the lower structured layer 9" is for example a structured metal oxide containing layer.

EXAMPLES OF THE INVENTION

Coating Deposition and Characterization Methods

The deposition of the coatings was performed in an INNOVA production system of OC Oerlikon Balzers AG. The substrates (polished disks of hardened steel and polished tungsten carbide inserts) were wet-chemical cleaned before deposition. After evacuation of the process chamber below $10^{-5}$ mbar, standard heating and etching steps were performed to ensure a good layer adhesion to the substrate. Elemental or composite metallic targets were utilized in combination with the appropriate reactive gases which were fed to the chamber via gas flow controllers. The chromium targets were produced by GfE Metalle and Materialien GmbH, the graphite targets by Steinemann AG, and the Mo, Al—Mo and Mo—Cu targets by PLANSEE Composite Materials GmbH. The coatings were mostly deposited on Cr—N interfaces. This interface was utilized because it forms a good adhesion layer to steel. In addition, Cr—N was also utilized as standard for the comparison with the other synthesized coatings because for this material many investigations had been accomplished in the past. The depositions of the coatings were performed under conditions similar to them described elsewhere. The synthesized layers represent a wide spectrum of materials: very hard ta-C, soft CrN and Mo-based coatings.

Surface roughness was characterized by measurements of the mean roughness depth $R_z$, the roughness average $R_a$, the reduced peak height $R_{pk}$, the reduced valley depth $R_{vk}$ and the material portions Mr1 and Mr2 of the coated samples before and after polishing according to the EN ISO standards utilizing a stylus instrument (Mahr Perthometer M1). The tip radius of the used stylus is 5 μm, the evaluation length was set with ln=4 mm (lr=0.8). The averaged surface roughness was calculated from three single measurements per sample and for the bare hardened steel substrate.

Optical microscopy (Olympus MX40) was utilized to investigate the wear track after SRV testing for identification of material transfer from the counter-part and removal of coating materials. The wear volume of the counter-part was calculated from the wear diameter of the counter-part.

A Zeiss LEO 1530 Gemini scanning electron microscope (SEM) equipped with a detector for Energy Dispersive X-ray (EDX) Analysis (from EDAX) was employed to examine the surface morphology and the fracture cross-section of the layers and to perform the compositional analysis of the material.

The layer composition was analyzed by Rutherford Backscattering Spectrometry (RBS) at the 6 MeV tandem accelerator of the Federal Institute of Technology in Zurich. The measurements were performed using a 2 MeV, $^4$He beam and a silicon surface barrier detector under 165°. The collected data were evaluated using the RUMP program. Elastic Recoil Detection (ERD) was utilized to estimate the hydrogen content of the ta-C coating by forward scattering.

The indentation hardness ($H_{IT}$) and the indentation modulus ($E_{IT}$) at room temperature were determined by Martens hardness measurements (Fisherscope H100c) following the ISO14577-1 guidelines.

It is beyond the scope of this work to investigate the crystal structure of the synthesized layers. However, selected results are mentioned to allow a comparison with references. In this case, the measurements were performed on a Bruker-AXS D8 Advance diffractometer with Gobel-Mirror and a solid state point detector using Cu $K_\alpha$-radiation in the θ-2θ-mode. The ICDD-data base was used to identify the crystallographic phases being present in the coatings.

The wear behaviour of the deposited coatings was investigated using a reciprocating wear tester (SRV®, Optimol Instruments). Detailed information about the test and the set-up can be found elsewhere. A spherical counter body is oscillating under load against the coated polished hardened steel sample. Hardened steel balls (1.3505, Grade 25, 60-68 HRC) with 10 mm diameter were utilized as counter body (Spheric-Trafalgar Ltd.). In the test, a load of 20 N, a frequency of 5 Hz and a stroke of 1 mm was employed. The friction force is continuously recorded by sensors at the test block so that the coefficient of friction can be calculated knowing the normal force. The tests were performed under dry and lubricated sliding conditions whereby 0W20 molybdenum dialkylthiocarbamate (0W20 Mo-DTC) oil was used as lubricant. All tests were accomplished at room temperature (23° C.±5° C.). The total duration of a test for unpolished substrates and dry conditions was 12.5 min, consisting of a running-in time of 2.5 min and the testing time of 10 min. During the running-in, the load was continuously increased from 2 N to 20 N. Due to the reduced wear for polished samples and under lubricated conditions, a duration of the test of 122.5 min was chosen including the same running-in procedure of 2.5 min. Polishing was performed manually. In a first step, the sample surfaces were treated with Scotch-Brite™ and afterwards polished with a polishing mob.

After the test the wear of the coated sample and the counter body were evaluated by optical microscopy.

Coating Properties

Table 1 summarizes the most relevant parameters of the cathodic arc deposition process: the cathode material, the utilized process gases and the deposition (substrate) temperature. With exception of the ta-C synthesis, only reactive gases without the addition of inert gases were utilized. In most cases, the functional layer was deposited on a $Cr_xN$ interface. Only for ta-C, a thin Cr interface was utilized. The thickness of the interface and the functional layers are also given in Table 1. The compositions of the synthesized coatings were measured by RBS and ERD. While for the metallic composition an error of ±3% is estimated, the nitrogen content can only be estimated with an error of ±10%. EDX was utilized to double-check the metallic composition in the layers and confirms the RBS results. The RBS spectrum for $Mo_{1.0}N_{1-x}O_x$ coating could be well simulated for a multilayer structure consisting of bilayers of $Mo_{1.0}N_{1.0}$ (120 nm) and $Mo_{1.00}N_{0.94}O_{0.06}$ (60 nm), respectively. The metallic ratio in the coatings produced from composite targets does not reflect for all samples the metallic ratio of the utilized targets. Sample C shows a pronounced "loss" of Al in the synthesized $Al_{0.76}Mo_{0.24}N_{1.15}$ compared to the target composition of $Al_{80}Mo_{20}$. The table contains also the mechanical properties of the coatings obtained by microhardness measurements, the indentation modulus $E_{IT}$ and the indentation microhardness $H_{IT}$.

In Table 2, the parameters describing surface roughness ($R_z$, $R_a$, $R_{pk}$, $R_{vk}$, Mr1 and Mr2) of the samples before and after polishing are listed. The roughness of the coatings deposited by arc evaporation is increased with coating thickness caused by the consecutive incorporation of droplets. However, the surface roughness of the synthesized coatings depends not alone on coating thickness. It is also influenced e.g. by the melting point of the target material, the fabrication method of the target, the target composition and the magnetic field of the arc source. Fracture cross section SEM (X-SEM) micrographs of the coatings deposited on tungsten carbide substrates are displayed in FIGS. 1 through 6 to illustrate the typical morphology of coatings. The $Cr_xN$ adhesive layer can easily be distinguished from the functional layer by its darker colour in the SEM images (FIG. 3-6). FIG. 1 shows the X-SEM micrograph of sample A. The thick $Cr_{1.0}N_{1.0}$ coating with an $R_z$ of 3.28 μm is characterized by a large number of droplets and openings in the layer indicating a loose integration of the droplets into the coating. The analysis of the crystal structure by XRD (not shown here) reveals face-centred cubic chromium nitride (IDD 03-065-2899) with some minor addition of body-centred cubic chromium (IDD 01-089-4055) which stem probably from droplets. This is in accordance with the results obtained in previous investigations for arc evaporated coatings utilizing low bias voltages. A glassy microstructure is found for the ta-C layer (FIG. 2) with a thickness of only 1.7 μm and an $R_z$ value of 1.73 μm. The X-SEM of $Al_{0.76}Mo_{0.24}N_{1.15}$ (FIG. 3) is characterized by a coarse microstructure and many defects in the grown layer. In comparison, the fracture cross-section of $Mo_{1.0}N_{1.0}$ (FIG. 4) and $Mo_{1.0}N_{1-x}O_x$ (FIG. 5) coatings are denser and indicate less droplet generation during growth. These three coatings have a thickness of about 15 μm and $R_z$ values between 3.46 μm and 4.31 μm. The surface roughness of $Mo_{0.85}Cu_{0.15}N_{1.0}$ (sample F) also falls in this roughness range ($R_z$=3.75 μm), although its layer thickness (FIG. 6a) is only 4.6 μm. This relatively high surface roughness can be explained by the presence of Cu-enriched droplets at the surface of the sample. These droplets were generated during the deposition and were loosely incorporated into the surface of the coating during growth (FIG. 6b). Therefore, the six samples fabricated by cathodic arc evaporation exhibit a wide spectrum of features with respect to morphology and surface roughness and may illustrate the usefulness of the reciprocating wear test for its ability of coating classification.

The measured surface roughness after polishing is also given in Table 2. A tendency for a classification of the materials can already be deduced by comparing the $R_{pk}$ values before and after polishing. These values characterize the reduction of the surface roughness for large $R_z$ values in the Abott-Firestone Curve. A pronounced decrease in this value from 0.03 to 0.04 μm is found for samples A, D and F. The values of sample C (0.17 μm) and sample E (0.11 μm) are higher. No decrease is observed for sample B (ta-C) from the initial $R_{pk}$ value of 0.53 μm to even somewhat higher 0.55 μm.

The different coating materials were investigated by the reciprocating wear test under dry-unpolished and lubricated-polished conditions. The counter-part material for all measurements was 100Cr6 steel. The test provides information about the time dependency of the CoF, the wear behaviour of the coated substrate and of its tribological counter-part. The wear volume which is deduced from the wear cap diameter created at the counter-part can be utilized to quantify counter-part wear. Optical microscopy was used to study material transfer, either from the counter-part to the coating or vice versa. FIG. 7 shows the CoF as a function of time for the investigated materials. The CoF at the end of the test ($CoF_{fin}$) is listed in Table 3 for dry-unpolished as well as lubricated-polished conditions. The table also lists the measured wear cap diameter and the counter-part wear volume. For the dry-unpolished experiment, the CoF curves in FIG. 7 suggest three categories of materials: The lowest friction coefficient with a tendency to further decrease was observed on the ta-C coated sample. However, the curve shows peaks which likely have been caused by the hard droplets of the coating. The highest friction is observed for $Cr_{1.0}N_{1.0}$ and $Al_{0.76}Mo_{0.24}N_{1.15}$ for which CoF values of approximately 0.8 and above were obtained. The MoN-based coatings, although having similar surface roughness to samples A and C, have lower and share similar friction coefficients (between 0.60 and 0.65), resulting in a medium friction range. The investigation of wear after the test by optical microscopy is shown in FIGS. 8a and b. The figures compare the surface of the coating (above) and the wear cap of the counter-part (below) for all samples after the test. The $Cr_{1.0}N_{1.0}$ (sample A) shows considerably material transfer from the counter-part to the wear track. This is different for sample B (ta-C). The wear track was flattened with no pronounced material transfer after the test. In contrast, the counter-part received carbon from the coating. The micrograph of sample C suggests a combination of both and indicates an undefined tribological situation, an assumption which is also supported by its non-constant CoF behaviour (FIG. 7). For the Mo—N based coating materials, no remarkable material transfer from the counter-part to the coated samples is visible. There is, however, material transfer from the coating to the counter-part. The wear of the counter-part is different among these samples. The wear volume is highest for $Mo_{1.0}N_{1.0}$ ($1.83*10^7$ $\mu m^3$) and lowest for $Mo_{0.85}Cu_{0.15}N_{1.0}$ ($1.36*10^6$ $\mu m^3$). The latter shows the lowest wear of the counter-part for unpolished surfaces and dry sliding conditions.

The time dependence of the CoF for the polished samples under lubricated conditions is depicted in FIG. 9 for which the test duration was increased to 122.5 min. The $CoF_{fin}$ of ta-C is reduced to 0.10. Despite the Mo-DTC lubrication, the curve is characterized by spikes. This coincides with the already discussed insufficient polishing which did not remove the strongly adherent droplets from the amorphous ta-C matrix. During graphitization of the ta-C which is indicated by the coverage of the counter-part, the gradual release of the droplets may produce these spikes. Sample C ($Al_{0.76}Mo_{0.24}N_{1.15}$) has the largest value with $CoF_{fin}$ of 0.17. In comparison to the amorphous appearance of sample B, the X-SEM micrograph of sample C shows a large number of grains and droplets in the layer and at the surface. This supports crack propagation and the generation of debris. $Cr_{1.0}N_{1.0}$ and $Mo_{1.0}N_{1.0}$ have the lowest friction coefficients with 0.07, while $Mo_{1.0}N_{1-x}O_x$ and $Mo_{0.85}Cu_{0.15}N_{1.0}$ share a somewhat higher $CoF_{fin}$ of 0.09. The micrographs of the wear tracks and the counter-part are shown in FIGS. 10a and b. The wear track of sample A does not indicate any coating wear and also the counter-part gives the impression of no wear. The cap of the counter-part which is shown by the micrograph is rather attributed to a reversible deformation of this area during the test than to real material removal. Sample B shows reduced wear ($7.29*10^5$ $\mu m^3$) of the counter-part under lubricated conditions. The ta-C coating seems stable, although at about 1500 s a step-like decrease of the CoF is visible which is probably to a change in contact area. However, some scratch traces can be seen from the hard carbon droplets which are released during the test. $Al_{0.76}Mo_{0.24}N_{1.15}$ also forms a stable coating for which no wear can be detected by optical microscopy. The counter-part wear is highest among the investigated samples. The debris generation already discussed above or sharp sized hard droplets may prevent a better polishing. Based on the wear cap diameter, samples D, E and F show a wear behaviour similar to $Cr_{1.0}N_{1.0}$. The slight brownish coloration of the counter-part for the $Mo_{1.0}N_{1.0}$ sample is attributed to a degradation or decomposition of the oil or the additive which does not affect the coating stability in the test. Also $Mo_{0.85}Cu_{0.15}N_{1.0}$ (sample F) generates a wear cap similar to $Cr_{1.0}N_{1.0}$. Outstanding is the situation for the $Mo_{1.0}N_{1-x}O_x$ samples. A wear of the counter-part is not detectable by optical microscopy and the ring is attributed to the reversible deformation of the counter-part. Despite of the different indentation hardnesses and indentation moduli of the coatings, the similar size of the visible wear cap diameters of samples A, D, E and F suggest this assumption. It was verified for sample F by an evaluation of the contact area which stems from elastic deformation only. The given test parameters (diameter of the counter-part and the load), the thickness of the $Cr_xN$ interface and of the $Mo_{1.0}N_{1-x}O_x$ coating and the mechanical constants given in Table 1 were utilized for this contact evaluation. The $E_{IT}$ of the hardened steel disk (substrate) and of the steel counter-part were measured to be 231 GPa and 222 GPa, respectively. Poisson's ratios of 0.25 and 0.3 were assumed for the coating and the hardened steel (disk and counter-part). The elastic contact region was evaluated applying a layered contact model which uses an extended Hertzian approach. As result, a contact diameter of 104.9 $\mu m$ was obtained, which coincides rather perfectly with the measured radius (97 $\mu m$) of the circle in FIG. 10b (middle part). Similar good agreement has also been found for the wear diameters of the other three samples.

Findings from the Experiments and from the Coating Analysis

Reactive cathodic arc evaporation is a versatile approach to synthesize complex thin film materials. There is no need for a sophisticated control of the reactive gases to avoid target poisoning like it is needed in sputtering technology. Additionally, composite targets support a nearly unlimited coating design which can be obtained by this method. A comparison of the chemical composition of the metallic constituents in the synthesized material with the target material demonstrates both possibilities: the target composition could be maintained for sample F ($Mo_{0.85}Cu_{0.15}N_{1.0}$), while for sample C ($Al_{0.76}Mo_{0.24}N_{1.15}$) a remarkable "loss" of Al was measured. Due to the low substrate bias of only −40 V and the exclusive utilization of nitrogen and no argon gas, re-sputtering from the substrate site during deposition is unlikely. The explanation of the effect of aluminium loss in the coating needs more detailed investigations. Important is that the composition of the deposited layers is reproducibly controlled by the target composition as it is shown in our experiments. It is believed that future requirements dictate very specific material design which involves besides nitrides and oxi-nitrides also pure oxides for the optimization of tribological systems. Cathodic reactive arc evaporation combines the ease of reactive gas control with the freedom in target design to respond to these requirements. The generation of droplets associated with non-filtered cathodic arc deposition process evoke skepticism about the utilization of the coatings for tribological applications. This is indeed a problem for materials which are difficult to polish (ta-C) by standard methods or which exhibit sharp and hard contours or produce hard debris also under lubricated conditions ($Al_{0.76}Mo_{0.24}N_{1.15}$). However, droplet formation may also be utilized to create holes in the coating by intention or to generate droplets which can be easily removed during polishing. FIG. 6b shows the surface of the $Mo_{0.85}Cu_{0.15}N_{1.0}$ sample. The surface of the coating is characterized by a number of droplets and by holes. During polishing, the large droplets can be easily removed which is reflected in a decrease of Mr1 from 15.8 to 9.1, i.e. by more than 40%. This means that large Rz values are decreased drastically. The reduction in Mr2 from 91.6 to 89.0 (decrease of less than 3%) is, however, only marginal. This means, that the "valley" character of the coating is maintained while large peaks are removed. The "valleys" are also maintained for ta-C. But in this case it is due to the difficulties in polishing which results in a nearly unchanged surface (even small increase in Mr1). "Valleys" may serve as reservoirs for the lubricant and improve the tribological performance of the system. A target design promoting the creation of "soft" droplets which are only loosely integrated into the harder coating matrix is therefore an additional potential for the arc deposition technology.

The reciprocating wear test was selected for the investigations because it has the potential to model wear behaviour in engines. The test can be conducted under different sliding conditions and can be varied with respect to counter-part material, lubricant, additives, temperature, and contact pressure. The test results indicate that all investigated coatings have too high surface roughness in the as deposited state resulting in material transfer or too high coefficients of friction. During running-in the material transfer or material transformations are different from those at the end of the test because of the higher contact pressure and the continuous changing contact conditions. We restricted ourselves on the status at the end of the test. For samples A and C, material transfer from the counter-part to the coating is visible which may represent an effect similar to "scuffing". For ta-C, a material transfer to the counter-part is observed which indicates that the hard ta-C is graphitized, leading to a form of solid lubrication. The coverage of the counter-part by this graphitized carbon is responsible for the low friction coefficient under dry conditions. It demonstrates the potential of ta-C for tribological applications under dry conditions. Polishing of the ta-C surface is, however, difficult and may not allow low cost applications. The coatings with a CoF between 0.6 and 0.65 do not show a material transfer to the coating at the end of the test. This may indicate "no scuffing" effects under dry or deficient lubrication, which is an important requirement for engine applications. However, $Mo_{1.0}N_{1.0}$ and $Mo_{1.0}N_{1-x}O_x$ cause high wear of the counter-part due to their high surface roughness and hardness. If there exist a solid lubrication effect for these two materials it is only active for the coated sample but not for the counter-part. ta-C ($3.40*10^6$ μm$^3$) and $Mo_{0.85}Cu_{0.15}N_{1.0}$ ($1.36*10^6$ μm$^3$) provoke the lowest wear of the counter-part among the unpolished samples although these coatings possess a high microhardness. Even the soft $Cr_{1.0}N_{1.0}$ induces slightly higher wear. The optical micrographs (FIGS. 8a and b) show for samples B and F a coverage of the counter-part by material which stems from the coated surface and reduce the counter-part wear. The results suggest that a post-treatment of the coatings deposited by arc evaporation is necessary or strongly recommended. However, surface finishing methods for e.g. piston rings (e.g. for $Cr_xN$) have been already in production since years and may easily applied also to new coating materials.

The results from the reciprocating wear test for the polished samples under lubricated conditions show an increase in performance for most of the materials. All coatings have low or no wear. Only in the ta-C layer, a few scratch patterns can be observed which again demonstrate wear by the very hard droplets. This and the small effect of the polishing (only 10% reduction in roughness) result in remarkable wear of the softer 100Cr6 steel counter-part. The counter-part wear for samples A, D, E and F is negligible. The wear cap diameter visualizes only the elastic deformation of the counter-part.

In summary, the investigations show that cathodic arc evaporation can realize a large variety of coating materials which may be utilized to optimize tribological systems in reciprocating engine applications. The results from the reciprocating wear test may be used as a first step of optimization or a pre-selection of coatings for further and more expensive tests or application in real engines. Mo-based materials showed promising results under the test conditions, especially for $Mo_{0.85}Cu_{0.15}N_{1.0}$ and for $Mo_{1.0}N_{1-x}O_x$ multilayer structures. For $Mo_{0.85}Cu_{0.15}N_{1.0}$, it seems possible to turn the disadvantage of droplet generation in cathodic arc evaporation into an advantage by removing weakly adhering droplets by polishing and keeping the holes in the coating which may act as lubricant reservoirs.

Further Important Aspects of the Present Invention

FIG. 7 shows that a few coating materials prevent the material transfer from the counter-part to the coated part. This is an important aspect in the design of tribological systems because material transfer means wear and reduced life time of the components in tribological system. Besides ta-C, the favoured coating materials to prevent the material transfer are MoN-based. Responsible for this is the solid lubrication which occurs for these materials at the surface under sliding conditions: graphitization for ta-C and oxidation for MoN-based materials. Solid lubrication can also be achieved or improved from soft material if these materials can be incorporated in hard coatings. This is the case if MoN is doped by Cu with the effect that not only material transfer to the coated part is prevented, but also the wear of the counter-part under dry and unpolished conditions is reduced. In this case obviously two effects play a role in improving sliding conditions. The first is again the self-lubricating effect caused by copper under high contact pressure based on a form of liquefaction. Depending on counter-part material, a coverage or partial coverage of the counter-part with copper will happen. In addition, another effect can be observed in the Mo—Cu—N coating. This is the creation of "valleys" or holes in the coating stemming from droplets during the evaporation of the target material. It is in this case a desirable by-product of arc evaporation from a composite target. These droplets are only loosely incorporated in the coating (in contrast to ta-C) and form already before polishing a surface with a lot of holes. The copper content of the droplets is higher compared to the Cu content in the matrix coating and the mechanical integration of the soft droplets in the matrix is only insufficient. This is at least partial due to the difference in the hardnesses between matrix coating and droplet and is also reflected by the marginal impact of polishing on Mr2. It indicates that already before polishing, a matrix coating with reservoirs for lubricants of solid and/or liquid nature was generated. This is an important design tool for coated surfaces and rather obvious for liquid lubrication. However, it becomes an essential tool for designing surfaces utilized in high temperature application for which normal lubricants are not suitable due to their high vapour pressure or insufficient chemical stability. For those applications, the "valleys" might be formed in the solid lubricant coating (Mo—Cu—N).

However, the utilization of solid lubricant coatings may not always deliver the best solution. This is indicated for the results displayed in FIG. 9. While the MoN-based coatings with "built-in" or designed self-lubrication properties (Mo—Cu—N and Mo—O—N) show $CoF_{final}$ of 0.09, the values for Mo—N and Cr—N are only 0.07. As discussed above, all four coatings show no or only negligible wear. However, sliding conditions are better for the pure metal-nitride coatings. This is believed to be the result of better wettability of the metal-nitride surfaces by the lubricant and its additives.

The issues discussed above suggest the following technological improvements for coated surfaces under sliding dry as well as lubricated and polished as well as unpolished conditions:

The combination of a running-in layer of Mo—Cu—N or Mo—O—N with Cr—N or another metal-nitride coating.

In additional experiments, oxide coatings produced by cathodic reactive arc evaporation were investigated with respect to their sliding properties by the reciprocal wear test.

The CoF for Zr—O, Al—Cr—C—O, and Al—Cr—O coatings are shown in FIGS. 11a,b and c, respectively. The coatings have some behaviour in common: they show very high CoF for dry conditions with only minor difference for unpolished and polished surfaces. This is probably due to the formation of debris of the oxide coatings in non-lubricated conditions. However, in the lubricated experiments with polished surfaces similar or even reduced wear is visible compared to the MoN-based or CrN-based coatings. For the Al—Cr—O coating, the wear cap diameter is lowest and only about 180 μm.

This suggests a second technological improvement:

The combination of a self-lubricant coating (Mo—Cu—N or M-O—N) with an oxide containing coating to improve the running-in properties of the oxide coatings. The oxide coating can be polished before the deposition of the self-lubricant coating or the self-lubricated coating must be thick enough to reduce the intrinsic surface roughness of the oxide coating underneath.

It is known from literature that many oxide coatings form temperature stable compounds with much better mechanical stability at high temperatures than normal metal-nitride coatings do. In experiments not shown here, pure Cr—N coatings are completely unstable under the utilized sliding conditions at 200° C., while e.g. Al—Cr—O coatings show no wear. In these test, an alumina counter-part was used.

In experiments for which the temperature was increased to 800° C. (again with the alumina counter-part), it could be observed that the CoF of the Al—Cr—O coating could be reduced from 0.6 at RT to 0.4 (dry conditions). Although this is a reduction of 30%, it is of course far from the CoF which can be obtained under lubricated condition at RT. At 800° C., however, normal lubrication does not work. Although, the inventors are not able to explain the self-lubrication process at high temperatures, sliding tests showed that the creation of "valleys" either in the oxide coating or in the self-lubricating coating improves the sliding conditions. The fraction of "valleys" (Mr2) could also be increased by polishing of the oxide coatings or the combination of self-lubricated overcoat and oxide coating.

Based on the investigations above, this suggests another technological improvement:

The combination of a temperature stable solid-lubrication coating with holes in the matrix coating covering the temperature stable oxide coating which may also show holes in the surface.

The coating systems comprising a self-lubricated outermost layer according to the present invention could be particularly beneficial for applications in tribological systems which must be operated under dry conditions. For example, for applications in tribological systems which are operated at elevated temperatures at which it is not possible to use any lubricant. In the case of a sliding tribological system, it comprises at least a first and a second sliding component and each sliding component has at least one sliding surface to be exposed to tribological contact (relative movement of one sliding surface in respect to the other). For avoiding or reducing wear of the involved sliding components, the sliding surface of the first sliding component and/or the sliding surface of the second sliding component should be coated (at least partially) with a coating system according to any of the embodiments of the present invention which includes a self-lubricated outermost layer.

Tables

TABLE 1

The most relevant deposition parameters, the chemical composition of the coatings and the mechanical properties of the coatings.

| Sample | Cathode Material | Process Gases | $T_{DEP}$ [C.] | Thickness Interface/ Functional Layer [μm] | Compositional Analysis of the Coating RBS | EDX | $H_{IT}$ [N/mm²] | $E_{IT}$ [GPa] |
|---|---|---|---|---|---|---|---|---|
| A | Cr | $N_2$ | 450 | 0/16.1 | $Cr_{1.0}N_{1.0}$ | Cr | 13728 ± 1064 | 280 ± 12 |
| B | Graphite | Ar | 150 | <0.1/1.7 | C (H < 1 at. %) | C | 52394 ± 7195 | 409 ± 31 |
| C | $Al_{80}Mo_{20}$ | $N_2$ | 450 | 5.2/10.6 | $Al_{0.76}Mo_{0.24}N_{1.15}$ | $Al_{74}Mo_{26}$ | 27674 ± 2148 | 257 ± 18 |
| D | Mo | $N_2$ | 450 | 4.6/9.8 | $Mo_{1.0}N_{1.0}$ | Mo | 19243 ± 1918 | 409 ± 58 |
| E | Mo | $N_2, O_2$ | 450 | 4.8/11.2 | $Mo_{1.0}N_{1-x}O_x$ | Mo | 28814 ± 1527 | 387 ± 15 |
| F | $Mo_{85}Cu_{15}$ | $N_2$ | 400 | 1.7/2.9 | $Mo_{0.85}Cu_{0.15}N_{1.0}$ | $Mo_{85}Cu_{15}$ | 28439 ± 2648 | 351 ± 34 |

TABLE 2

Measurement of the surface roughness before and after polishing.

| | Surface roughness before polishing | | | | | | Surface roughness after polishing | | | | | |
|---|---|---|---|---|---|---|---|---|---|---|---|---|
| Sample | $R_z$ [μm] | $R_a$ [μm] | $R_{pk}$ [μm] | $R_{vk}$ [μm] | Mr1 % | Mr2 % | $R_z$ [μm] | $R_a$ [μm] | $R_{pk}$ [μm] | $R_{vk}$ [μm] | Mr1 % | Mr2 % |
| A | 3.28 | 0.43 | 1.01 | 0.24 | 18.3 | 94.1 | 0.27 | 0.02 | 0.03 | 0.04 | 9.5 | 89.1 |
| B | 1.73 | 0.23 | 0.53 | 0.26 | 17.6 | 93.8 | 1.65 | 0.23 | 0.55 | 0.18 | 20.5 | 94.3 |
| C | 4.29 | 0.54 | 1.32 | 0.70 | 15.0 | 93.2 | 1.36 | 0.11 | 0.17 | 0.25 | 10.8 | 86.3 |
| D | 4.31 | 0.46 | 1.43 | 0.21 | 17.5 | 94.1 | 0.46 | 0.03 | 0.03 | 0.13 | 8.7 | 81.9 |

TABLE 2-continued

Measurement of the surface roughness before and after polishing.

| | Surface roughness before polishing | | | | | | Surface roughness after polishing | | | | | |
|---|---|---|---|---|---|---|---|---|---|---|---|---|
| Sample | $R_z$ [μm] | $R_a$ [μm] | $R_{pk}$ [μm] | $R_{vk}$ [μm] | Mr1 % | Mr2 % | $R_z$ [μm] | $R_a$ [μm] | $R_{pk}$ [μm] | $R_{vk}$ [μm] | Mr1 % | Mr2 % |
| E | 3.46 | 0.44 | 1.19 | 0.22 | 17.9 | 94.4 | 0.64 | 0.07 | 0.11 | 0.15 | 12.6 | 88.9 |
| F | 3.75 | 0.36 | 1.17 | 0.29 | 15.8 | 91.6 | 0.57 | 0.03 | 0.04 | 0.10 | 9.1 | 89.0 |
| Steel Substrate | 0.19 | 0.02 | 0.03 | 0.02 | 9.31 | 90.44 | n/a | n/a | n/a | n/a | n/a | n/a |

TABLE 3

Characterization of the tribology by the SRV test for unpolished samples under dry conditions and polished samples under lubricated conditions. The wear volume was calculated after [24, page 17(2)].

| | Unpolished/Dry Conditions (after 12.5 min) | | | | Polished/Lubricated Conditions (after 122.5 min) | | | |
|---|---|---|---|---|---|---|---|---|
| | | Material Transfer | | Ø Wear Cap [μm] | | Material Transfer | | Ø Wear Cap [μm] |
| Sample | $CoF_{fin}$ | → coating | → counter part | Wear Volume [μm³] | $CoF_{fin}$ | → coating | → counter part | Wear Volume [μm³] |
| A | 0.79 | Yes | No | 876  5.78 * 10⁶ | 0.07 | No | No | 219  2.26 * 10⁴ |
| B | 0.18 | No | Yes | 767  3.40 * 10⁶ | 0.10 | Scratches | Yes | 522  7.29 * 10⁵ |
| C | 0.87 | Yes | Yes | 1135  1.63 * 10⁷ | 0.17 | No | Yes | 1009  1.02 * 10⁷ |
| D | 0.64 | No | Yes | 1169  1.83 * 10⁷ | 0.07 | No | (Yes) | 225  2.52 * 10⁴ |
| E | 0.64 | No | Yes | 1076  1.32 * 10⁷ | 0.09 | No | No | 206  1.77 * 10⁴ |
| F | 0.63 | No | Yes | 610  1.36 * 10⁶ | 0.09 | No | No | 194  1.39 * 10⁴ |

What is claimed is:

1. Sliding component (10) having a sliding surface to be exposed to relative movement with respect to another component under lubricated conditions, wherein the sliding surface of the sliding component (10) is at least partially coated with a coating system (1) comprising an outermost layer (7), characterized in that,
   the outermost layer (7) is an oxide-containing layer having mechanical stability at high temperatures and at least mostly comprising a metal oxide, the layer (7) having an element composition defined by the formula $Me_{1-b-c}X_cO_b$ with b>0 and at least twice as large as c and with c>0, where
   Me is a metal different from Mo or a combination of metals other than Mo, Me having a concentration in atomic percent of 1−b−c, and
   O is oxygen having a concentration in atomic percent of b, and
   X is or contains nitrogen and/or carbon, having a concentration in atomic percent of c,
   wherein the outermost layer (7) has a smooth or smoothed surface which exhibits essentially no protrusions but which exhibits recesses, and
   wherein the outermost layer (7) comprises arc-PVD droplets.

2. Sliding component (10) according to claim 1, characterized in that the surface of the outermost layer (7) comprises a multitude of essentially circular recesses with diameters of several micrometers or below, the recesses randomly distributed over the surface.

3. Sliding component (10) according to claim 1, characterized in that the surface of the outermost layer (7) is a polished surface.

4. Sliding component (10) according to claim 1, characterized in that, the coating system (1) comprises additionally:
   at least one bonding strength layer (3) for improving coating adhesion, and
   at least one metal nitride containing layer (5) and
   at least one additional oxide-containing layer (6) arranged under the outermost layer (7), the additional oxide-containing layer (6) differing from the outermost layer (7).

5. The sliding component (10) according to claim 4 wherein the at least one metal nitride containing layer (5) is chromium nitride or a molybdenum nitride.

6. The sliding component (10) according to claim 1, characterized in that, the coating system (1) comprises additionally:
   at least one metal nitride containing layer (5) and
   at least one additional oxide-containing layer (6) arranged under the outermost layer (7), the additional oxide-containing layer (6) differing from the outermost layer (7).

7. The sliding component (10) according to claim 6 wherein that at least one metal nitride containing layer (5) is chromium nitride or a molybdenum nitride.

8. The sliding component (10) according to claim 1, wherein the sliding surface of the sliding component (10) is disposed in contact with a surface of the component and wherein the sliding component (10) and the component slide relative to each other.

9. The sliding component (10) according to claim 1, wherein X is or contains carbon having a concentration in atomic percent of c.

\* \* \* \* \*